(12) United States Patent
Wu et al.

(10) Patent No.: US 7,265,702 B1
(45) Date of Patent: Sep. 4, 2007

(54) METHOD FOR CONVERTING AN ANALOG SIGNAL TO MULTIPLE DIFFERENT PHASE OUTPUTS UTILIZING AN ANALOG-TO-DIGITAL CONVERTER

(75) Inventors: Li-Te Wu, Taipei (TW); Wei-Chan Hsu, Cupertino, CA (US)

(73) Assignee: Fortemedia, Inc., Cupertino, CA (US)

( * ) Notice: Subject to any disclaimer, the term of this patent is extended or adjusted under 35 U.S.C. 154(b) by 0 days.

(21) Appl. No.: 11/457,825

(22) Filed: Jul. 17, 2006

(51) Int. Cl.
*H03M 1/34* (2006.01)

(52) U.S. Cl. .................. 341/158; 341/143; 341/155; 375/316; 375/216; 375/350

(58) Field of Classification Search ............... 341/158, 341/155, 143; 375/316, 216, 350
See application file for complete search history.

(56) References Cited

U.S. PATENT DOCUMENTS 6,307,903 B1 * 10/2001 Harris et al. ............... 375/350
6,546,044 B1 * 4/2003 Dent .......................... 375/216
6,813,320 B1 * 11/2004 Claxton et al. ............. 375/316

OTHER PUBLICATIONS

E Roza et al., "A DLL-Based Poly-phase Sampler for a Slgma Delta ADC", pp. 106-111, date is unknown.*
Roza, "Poly-Phase Sigma-Delta Modulation", IEEE Transactions on Circuits and SYstems II: Analog and digital signal Processing), vol. 44, No. 11, Nov. 1997, pp. 915-923.*

* cited by examiner

*Primary Examiner*—Jean Bruner Jeanglaude
(74) *Attorney, Agent, or Firm*—Thomas, Kayden, Horstemeyer & Risley

(57) ABSTRACT

A method for converting an analog signal to multiple different phase outputs with an analog-to-digital converter is provided. First, the analog signal is converted to a high-frequency datastream with a delta-sigma modulator. A plurality of low-frequency datastreams are then generated by periodically extracting the samples of the high-frequency datastream, wherein consecutively extracted samples of the high-frequency datastream are scattered to different low-frequency datastreams. The low-frequency datastreams have the same sampling rate, and the phases of the corresponding samples of the low-frequency datastreams are different from each other.

22 Claims, 6 Drawing Sheets

METHOD FOR CONVERTING AN ANALOG SIGNAL TO MULTIPLE DIFFERENT PHASE OUTPUTS UTILIZING AN ANALOG-TO-DIGITAL CONVERTER

BACKGROUND OF THE INVENTION

1. Field of the Invention

The invention relates to analog-to-digital converters (ADC), and more particularly to an analog-to-digital converter comprising delta-sigma modulators.

2. Description of the Related Art

Delta-sigma modulation is a popular method for high resolution analog-to-digital conversion. It is frequently used in audio processing and has a wide rage of applications. Because most audio signals are presently transmitted, processed, and stored in digital form, analog signals must be converted to digital signals for further processing. When an analog signal is converted to digital form, a one-bit data stream is desirable in many applications because there is a one-to-one correspondence between the input clock and the output data. The number of signals required for a system to communicate with the ADC is two. Thus, delta-sigma modulation is widely used.

FIG. 1 is a block diagram of a portion of an audio processing device 100, which includes an conventional analog-to-digital converter 108. The audio processing device 100 includes a microphone module 102, the analog-to-digital converter 108, and a digital signal processing (DSP) module 110. The microphone module 102 receives the external sound wave and converts it to an analog signal. The DSP module 110 is the core of the audio processing device 100 and undertakes the major load of audio processing tasks. Because the DSP module 110 can only handle digital signals, the analog signal must be transformed to digital format. The analog signal is delivered to the analog-to-digital converter 108 and further converted to a medium frequency datastream, which is used as the digital input signal of the DSP module 110 in substitution for the analog signal.

The analog-to-digital converter 108 includes a delta-sigma modulator 104 and a decimator 106. The analog signal is first converted by the delta-sigma modulator 104 to a high-frequency datastream. The high-frequency datastream is then decimated by the decimator to generate the medium-frequency datastream, which is the output of the analog-to-digital converter 108. "Decimation" indicates periodically dropping the undesired samples of the high-frequency datastream according to a decimating factor, so that the remnant samples of the high-frequency datastream meet a desirable sampling rate, wherein the decimating factor is given by the quotient between the sampling rate of input and output signals.

The analog-to-digital converter 108 of FIG. 1, however, lacks the ability to generate multiple outputs of different phases. When the DSP module 110 requires input signals of different phases for further processing, the DSP module 110 has to transform the medium-frequency datastream to the different phase signals itself, wasting processing resources of the DSP module 110 and complicating the design of the DSP module 110. If the analog-to-digital converter 108 can directly generate the different phase output signals according to the analog signal, the processing load of the DSP module 110 can be reduced. In addition, since the sampling frequency of the plurality of low-frequency datastreams are less than that of the medium-frequency datastream, the DSP module 110 can operate at a lower frequency, and the power consumption of the system can be reduced. Furthermore, if not all samples of the medium-frequency datastream is required in some situations according to the requirements of the DSP module 110, the medium-frequency datastream samples of predetermined phase can be extracted by the analog-to-digital converter 108 to generate only the desired datastreams required by the DSP module 110.

BRIEF SUMMARY OF THE INVENTION

The invention provides a method for converting an analog signal to multiple different phase outputs with an analog-to-digital converter. First, the analog signal is converted to a high-frequency datastream with a delta-sigma modulator. A plurality of low-frequency datastreams are then generated by periodically extracting the samples of the high-frequency datastream, wherein consecutively extracted samples of the high-frequency datastream are scattered to different low-frequency datastreams. The low-frequency datastreams have the same sampling rate, and the phases of the corresponding samples of the low-frequency datastreams are different from each other.

The invention also provides an analog-to-digital converter capable of converting an analog signal to multiple different phase outputs. The analog-to-digital converter comprises a delta-sigma modulator and a poly-phase decimator. The delta-sigma modulator first converts the analog signal to a high-frequency datastream. The poly-phase decimator then generates a plurality of low-frequency datastreams by periodically extracting the samples of the high-frequency datastream, wherein consecutively extracted samples of the high-frequency datastream are scattered to different low-frequency datastreams. The low-frequency datastreams have the same sampling rate, and the phases of the corresponding samples of the low-frequency datastreams are different from each other.

The invention also provides a poly-phase decimator. The poly-phase decimator receives a high-frequency datastream and comprises a first decimator, a plurality of delay modules, and a plurality of second decimators. The first decimator downsamples the high-frequency datastream to generate a medium-frequency datastream having a first sampling period. The delay modules delay the medium-frequency datastream for different delay periods to generate a plurality of delayed medium-frequency datastreams, wherein all of the delay periods are different multiples of the first sampling period. The second decimators respectively downsample one of the delayed medium-frequency datastreams according to a decimating factor to generate a plurality of delayed low-frequency datastreams, which comprise the output of the poly-phase decimator.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 4b~4e respectively show the low-frequency datastreams corresponding to the medium frequency datastream of FIG. 4a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
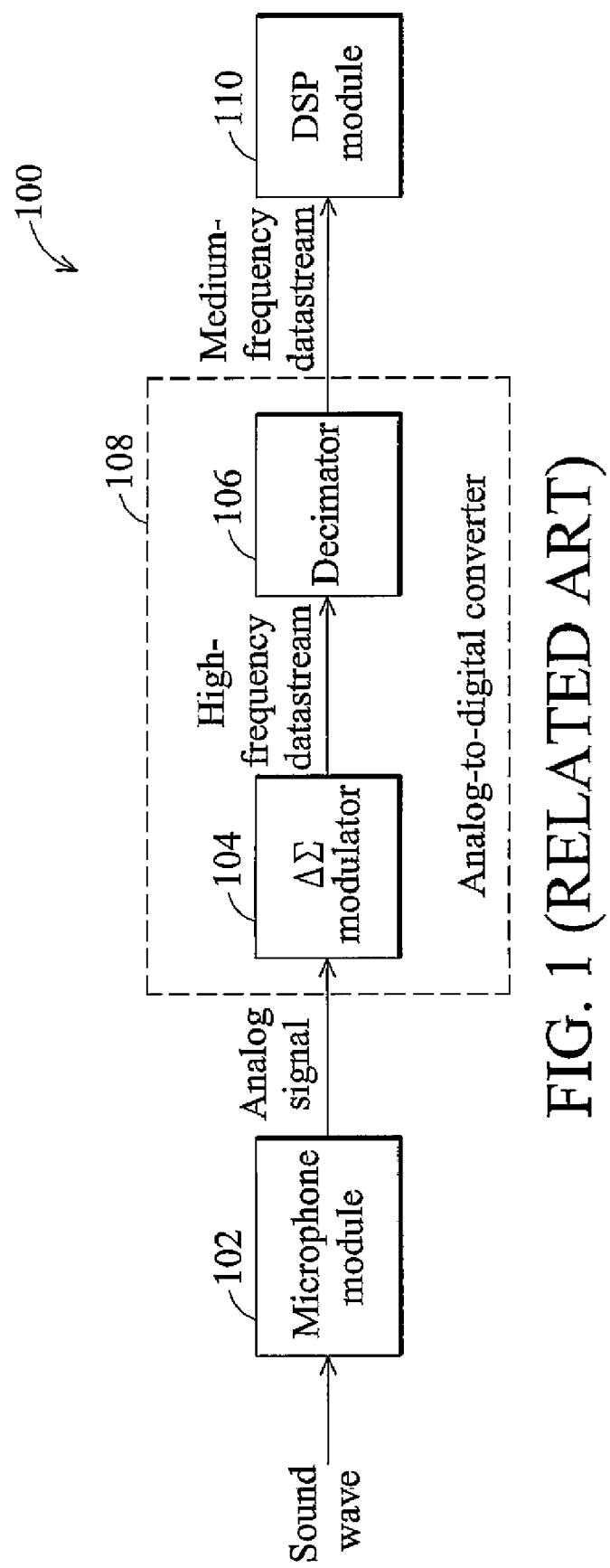
FIG. 1 is a block diagram of a portion of an audio processing device including a conventional analog-to-digital converter.
Figure 2:
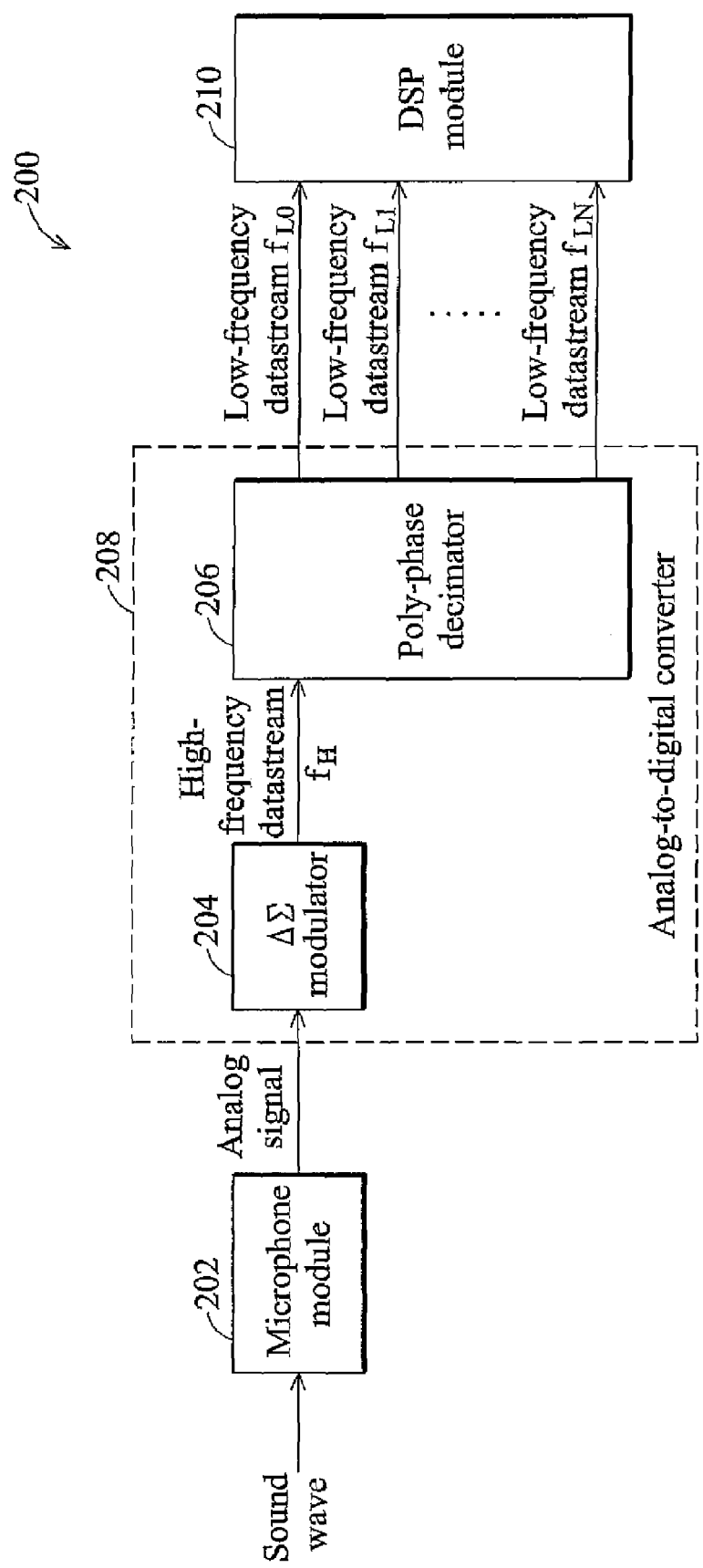
FIG. 2 is a block diagram of a portion of an audio processing device including an analog-to-digital converter generating multiple different phase outputs according to the invention.

FIG. 2 is a block diagram of a portion of an audio processing device 200, which includes an analog-to-digital converter 208 generating multiple different phase outputs according to the invention. The audio processing device 200 is roughly similar to the audio processing device 100 and includes a microphone module 202, the analog-to-digital converter 208, and a digital signal processing (DSP) module 210. The microphone module 202 receives an exterior sound wave and converts it to an analog signal. Unlike the analog-to-digital converter 108, the analog-to-digital converter 208 converts the analog signal to a plurality of low-frequency datastreams $f_{L0} \sim f_{LN}$, which have the same sampling rate. The low-frequency datastreams $f_{L0} \sim f_{LN}$ are then received by the DSP module 210 for further processing.

The analog-to-digital converter 208 includes a delta-sigma modulator 204 and a poly-phase decimator 206. The delta-sigma modulator 204 first converts the analog signal to a high-frequency datastream $f_H$. The poly-phase decimator 206 then periodically extracts the samples of the high-frequency datastream to generate the plurality of low-frequency datastreams $f_{L0} \sim f_{LN}$, wherein consecutively extracted samples of the high-frequency datastream are sequentially scattered to different low-frequency datastreams $f_{L0} \sim f_{LN}$. Therefore, the corresponding samples of the low-frequency datastreams $f_{L0} \sim f_{LN}$ differ from each other by predetermined phase differences. The composition and inner motion of the poly-phase decimator 206 is shown in FIG. 3.

Figure 3:
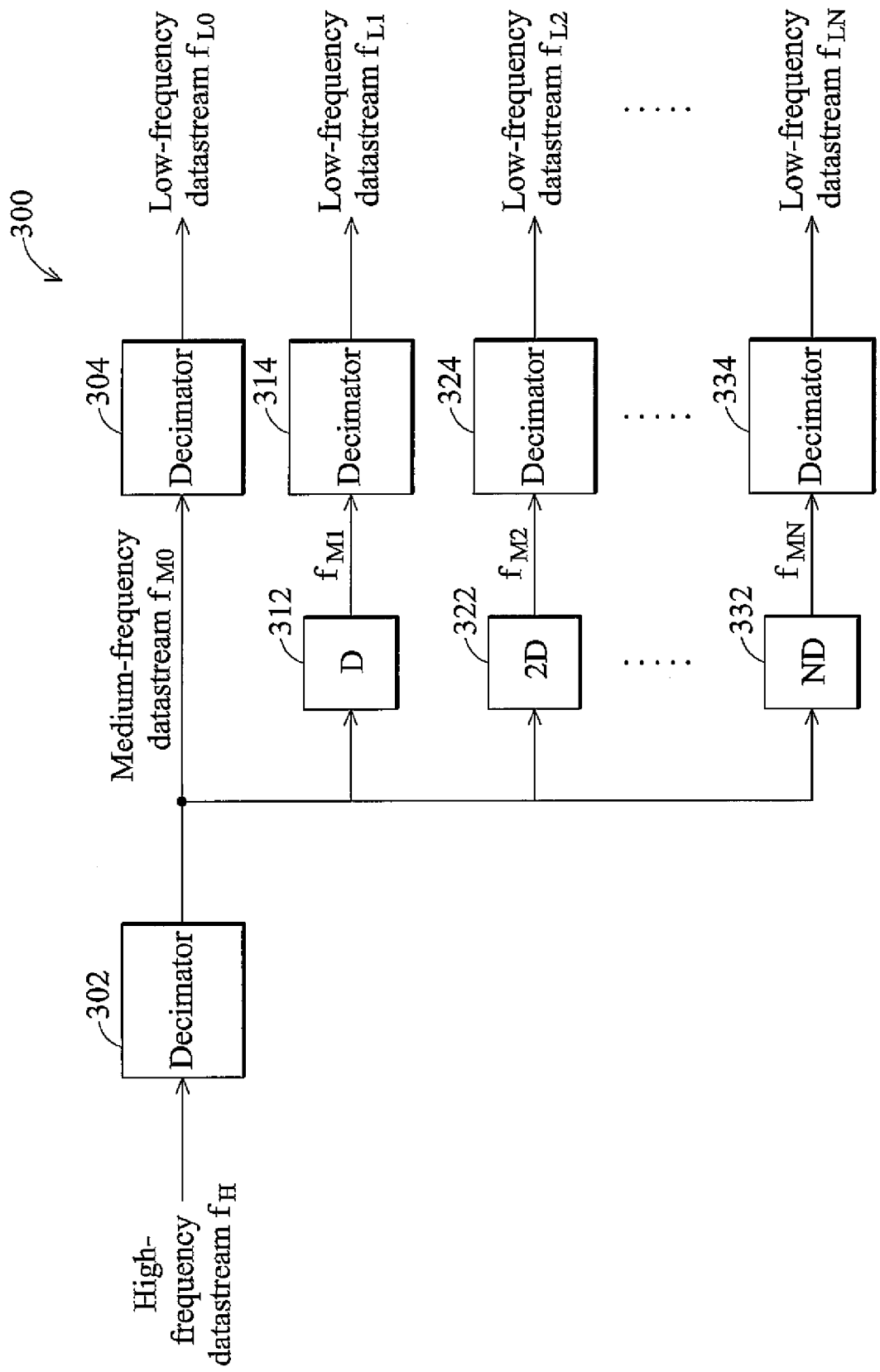
FIG. 3 is a block diagram of an embodiment of a poly-phase decimator according to the invention.

FIG. 3 is a block diagram of an embodiment of a poly-phase decimator 300 according to the invention. The poly-phase decimator 300 includes a decimator 302, a plurality of delay modules 312, 322, . . . , and 332, and a plurality of decimators 304, 314, 324, . . . , and 334. The high-frequency datastream $f_H$ generated by a delta-sigma modulator is first downsampled by the decimator 302 to obtain the medium-frequency datastream $f_{M0}$. "Downsampling" is equivalent in meaning to "Decimation" and means periodically dropping the undesired samples of the high-frequency datastream to let the output samples meet a desirable sampling rate. The delay modules 312, 322, . . . , and 332 then respectively delay the medium-frequency datastream $f_{M0}$ for different delay periods to generate a plurality of delayed medium-frequency datastreams $f_{M1} \sim f_{MN}$. Assume that the time between two samples, or the sampling period, of the medium-frequency datastream $f_{M0}$ is a first sampling period. Thus, all the delay periods of the delay modules 312, 322, . . . , and 332 are different multiples of the first sampling period. For example, the delay module 312 and 322 respectively delay the medium-frequency datastream $f_{M0}$ for one and two times the first sampling period, and the delay module 332 delays the medium-frequency datastream $f_{M0}$ for N times the first sampling period, wherein N is a natural number and equivalent to the number of delay modules.

Because the delay periods of the delay modules 312, 322, . . . , and 332 are different multiples of the first sampling period, the corresponding samples of the delayed medium-frequency datastreams $f_{M1} \sim f_{MN}$ are only shifted for one sampling period in turn, i.e. the phase difference between two delayed medium-frequency datastreams differing by one order is just one first sampling period. The decimators 314, 324, . . . , and 334 then downsample one of the delayed medium-frequency datastreams $f_{M1} \sim f_{MN}$ according to a decimating factor to respectively generate the low-frequency datastreams $f_{M1} \sim f_{MN}$. The decimator 304 also downsamples the medium-frequency datastream $f_{M0}$ according to the same decimating factor to generate the low-frequency datastreams $f_{L0}$. A decimating factor indicates the quotient between the sampling rate of input and output datastreams of a decimator. Because the number of the delay modules 312, 322, . . . , and 332 is N, the number of the low-frequency datatstreams is N plus one. If the decimating factor of the decimators 304, 314, 324, . . . , and 334 is equal to N plus one, i.e. the number of the low-frequency datatstreams, the remnant samples of the low-frequency datastreams $f_{L0} \sim f_{LN}$ can exactly comprise the total samples of the medium frequency datastream $f_{M0}$, wherein corresponding samples of the low-frequency datastreams $f_{L0} \sim f_{LN}$ are the consecutive samples of the medium frequency datastream $f_{M0}$. This will be further explained with reference to FIG. 4 in the following.

Figure 4A:
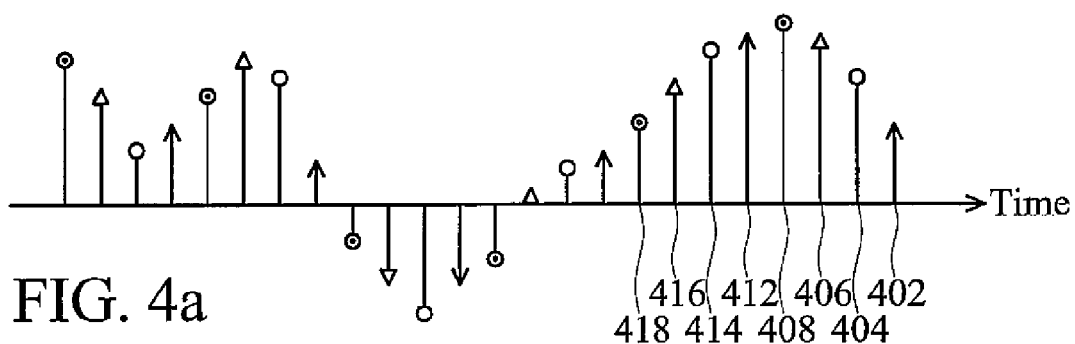
FIG. 4a shows an example of the medium frequency datastream of FIG. 3.
Figure 4B:
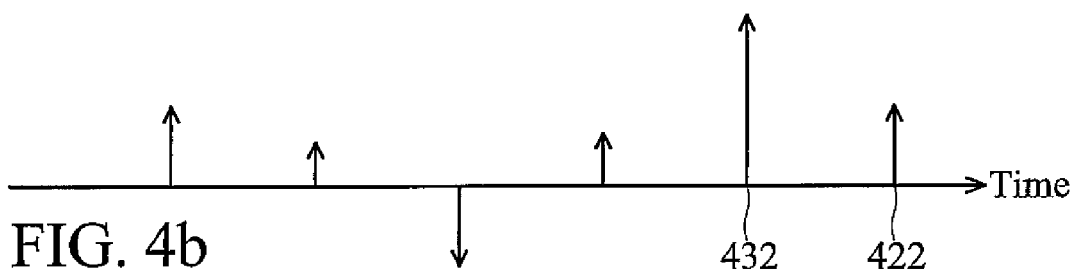
Figure 4C:
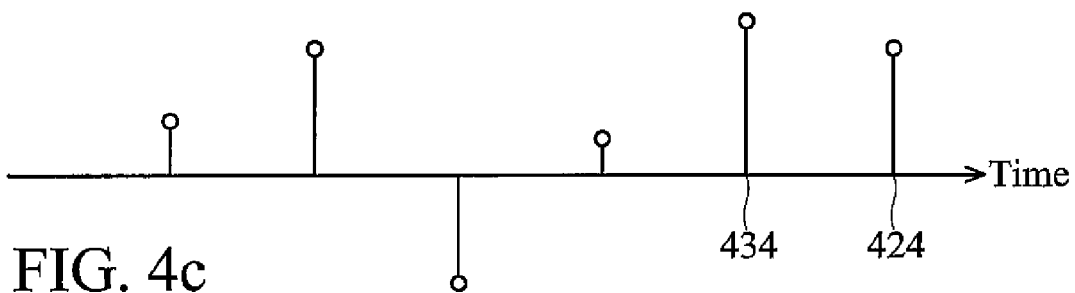
Figure 4D:
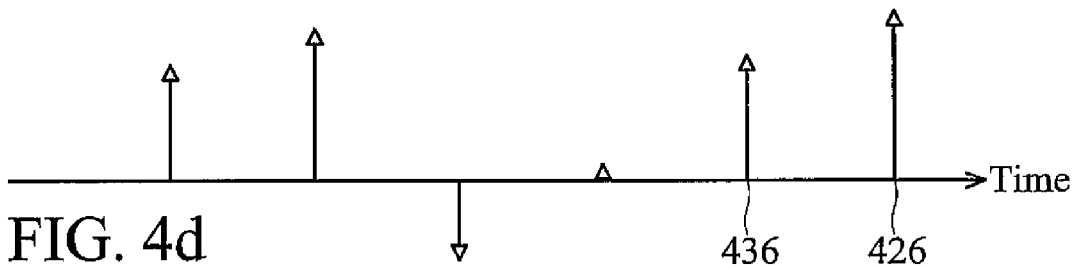
Figure 4E:
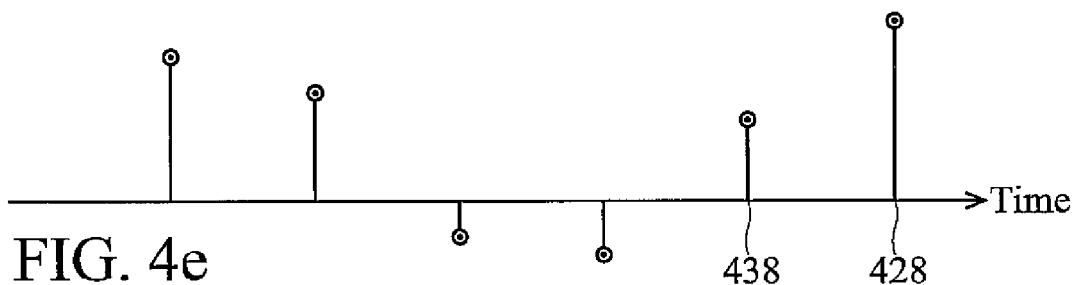

FIG. 4a shows an example of the medium frequency datastream $M_0$ of FIG. 3. The medium frequency datastream $f_{M0}$ includes consecutive samples 402~418. Among the samples 402~418, the samples 402 and 412 are marked with arrows, the samples 404 and 414 are marked with circles, the samples 406 and 416 are marked with triangles, and the samples 408 and 418 are marked with concentric circles. Assume that the number N of the delay modules is three. Therefore, there are four low-frequency datastreams $f_{L0} \sim f_{L3}$ in total. FIG. 4b, 4c, 4d and 4e respectively show the low-frequency datastreams $f_{L0}$, $f_{L1}$, $f_{L2}$, and $f_{L3}$ corresponding to the medium frequency datastream $f_{M0}$ of FIG. 4a. Because the low-frequency datastream $f_{L0}$ is not delayed, the time index of the samples 402 and 412 are the same as their original time index in the medium frequency datastream $f_{M0}$ of FIG. 4a.

First, the delay modules 312, 322 and 332 respectively delay the medium frequency datastream $f_{M0}$ for one, two, and three sampling periods of the medium frequency datastream $f_{M0}$. Therefore, the second sample 404 of the medium frequency datastream $f_{M0}$ is shifted to the first sample of the delayed medium-frequency datastream $f_{M1}$, such as the sample 424 of FIG. 4c. Accordingly, the third and fourth sample 406 and 408 of the medium frequency datastream $f_{M0}$ are respectively shifted to the first sample of the delayed medium-frequency datastreams $f_{M2}$ and $f_{M3}$, such as the first sample 426 of FIG. 4d and the first sample 428 of FIG. 4e. Thus, the phase difference between two low-frequency datastreams differing by one order is just one sampling period of the medium frequency datastream $f_{M0}$.

Next, the decimators 314, 324, and 334 downsamples the delayed medium-frequency datastreams $f_{M1}$, $f_{M2}$ and $f_{M3}$ according to a decimating factor of four, which is equal to the number of the low-frequency datastreams $f_{L0} \sim f_{L3}$. Therefore, only one sample of every four sample of the delayed medium-frequency datastreams $f_{M1}$, $f_{M2}$ and $f_{M3}$ is retained to generate the low-frequency datastreams $f_{L1}$, $f_{L2}$ and $f_{L3}$. Thus, the three samples between the sample 424 and 434, 426 and 436, and 428 and 438 of the delayed medium-frequency datastreams $f_{M1}$, $f_{M2}$ and $f_{M3}$ are respectively dropped. Accordingly, because the medium frequency datastream $f_{M0}$ is downsampled by the decimator 304 according to the same factor of four, the three samples between the sample 422 and 432 are dropped to form the low-frequency datastreams $L_1$ of FIG. 4b. It can be seen in the FIG. 4b~4e that the samples of the low-frequency datastreams $f_{L0} \sim f_{L3}$ can exactly comprise the total samples of the medium frequency datastream $f_{M0}$ of FIG. 4a, and the corresponding samples 422, 424, 426 and 428 of the low-frequency datastreams $f_{L0} \sim f_{L3}$ are the consecutive samples 402, 404, 406 and 408 of the medium frequency datastream $f_{M0}$.

Figure 5:
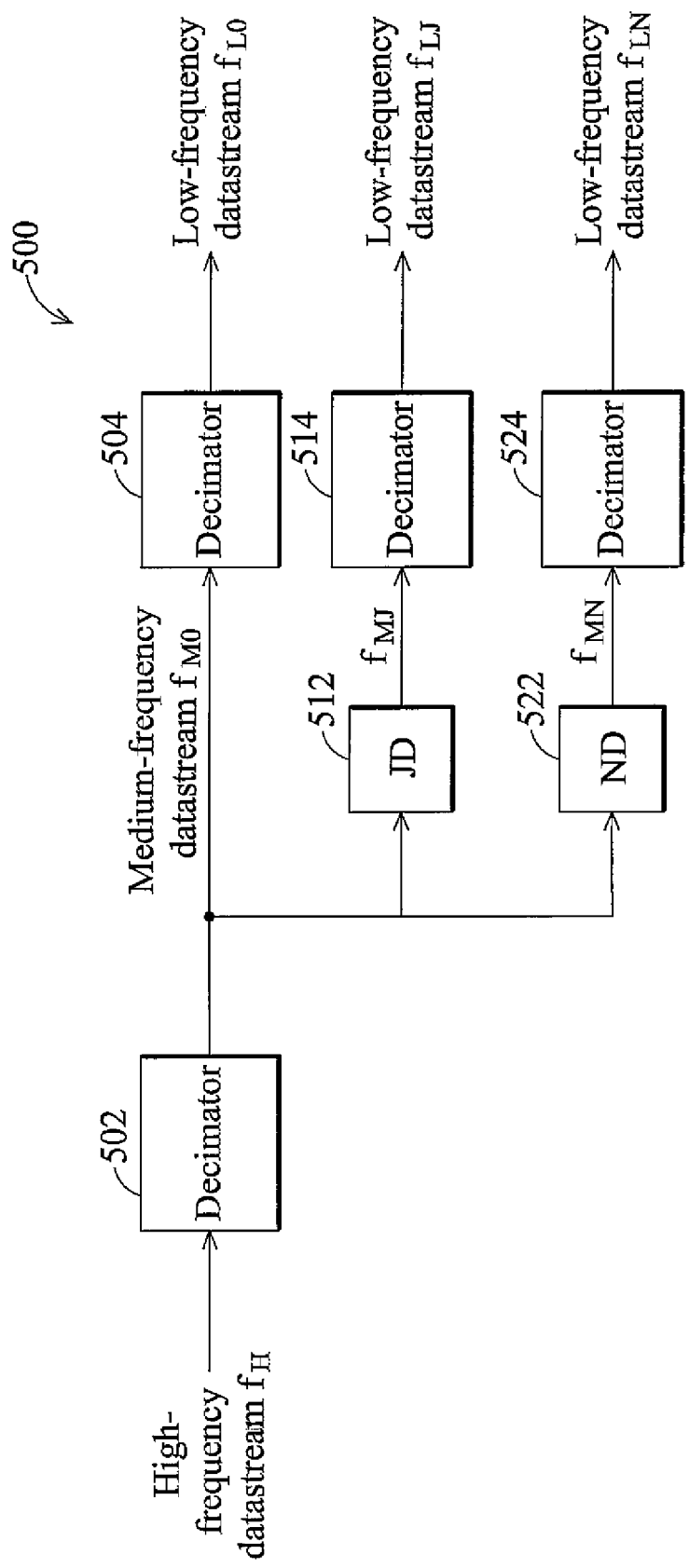
FIG. 5 is a block diagram of another embodiment of a poly-phase decimator according to the invention.

FIG. 5 is a block diagram of another embodiment of a poly-phase decimator 500 according to the invention. The poly-phase decimator 500 is roughly similar to the poly-phase decimator 300 and can be used as the poly-phase decimator 206 of FIG. 2. The only difference between the poly-phase decimators 500 and 300 is that only the desired low-frequency datastreams required by the DSP module 210, such as $f_{L0}$, $f_{LJ}$ and $f_{LN}$ of FIG. 5, is generated by the poly-phase decimator 500. The poly-phase decimator 500 includes a decimator 502, delay modules 512 and 522, and decimators 504, 514 and 524.

The high-frequency datastream $f_H$ generated by a delta-sigma modulator is first downsampled by the decimator 502 to obtain the medium-frequency datastream $M_0$. Suppose that only three datastreams of predetermined phase are required according to the DSP module 210. Thus, there are only two delay modules 512 and 522 in the poly-phase decimator 500, and the delay modules 512 and 522 respectively delay the medium-frequency datastream $f_{M0}$ for J and N sampling periods of the medium-frequency datastream $f_{M0}$ to generate the delayed medium-frequency datastreams $f_{MJ}$ and $f_{MN}$. The decimators 514 and 524 then respectively downsample the delayed medium-frequency datastreams $f_{MJ}$ and $f_{MN}$ according to a decimating factor to generate the low-frequency datastreams $f_{L0}$ and $f_{LN}$. The decimator 504 also downsamples the medium-frequency datastream $f_{M0}$ according to the same decimating factor to generate the low-frequency datastreams $f_{L0}$. The decimating factor is equal to the N plus one, wherein N is the delay coefficient of the delay module 522 and indicates the quotient between the delay period of delay module 522 and the sampling period of the medium-frequency datastream $f_{M0}$.

Figure 6:
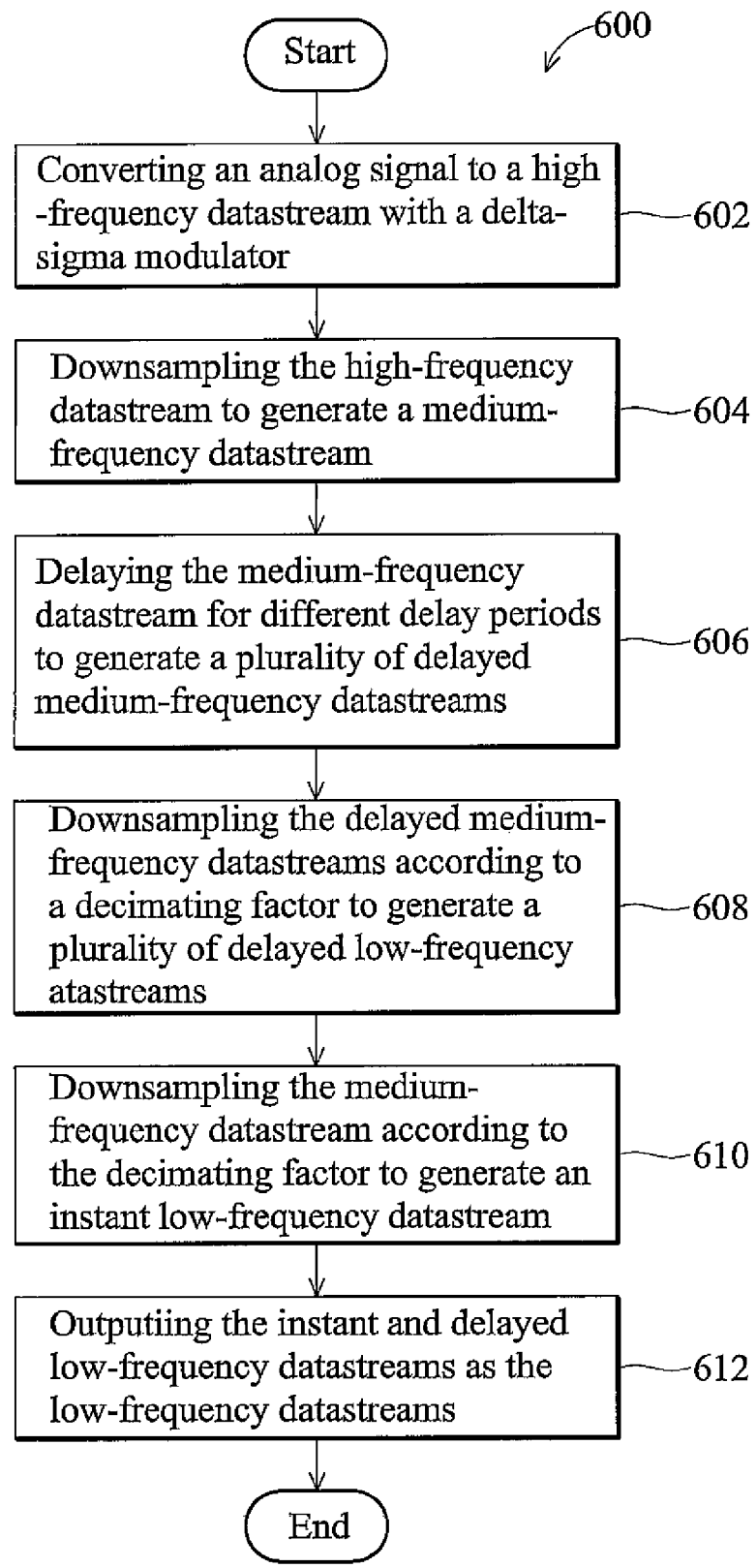
FIG. 6 is a flowchart of a method for converting an analog signal to multiple different phase outputs with an analog-to-digital converter.

FIG. 6 is a flowchart of a method 600 for converting an analog signal to multiple different phase outputs with an analog-to-digital converter. First, the analog signal is converted to a high-frequency datastream with a delta-sigma modulator in step 602. The high-frequency datastream is then downsampled in step 604 to obtain a medium-frequency datastream. The medium-frequency datastream is then delayed for a plurality of delay periods in step 606 to generate a plurality of delayed medium-frequency datastreams, wherein the delay periods are different multiples of the sampling period of the medium-frequency datastream. The delayed medium-frequency datastreams are then downsampled according to a decimating factor in step 608 to generate a plurality of delayed low-frequency datastreams. The medium-frequency datastream is also downsampled according to the same decimating factor in step 610 to generate an instant low-frequency datastream. Finally, the delayed low-frequency datastreams and the instant low-frequency datastream are output as the low-frequency datastreams in step 612.

The invention provides a method for converting an analog signal to multiple different phase outputs with an analog-to-digital converter. The analog-to-digital converter includes a poly-phase decimator generating a plurality of low-frequency datastreams with the same sampling rate, wherein each corresponding sample of the low-frequency datastreams differs from another by a predetermined phase difference. When a DSP module requires input signals of different phases for further processing, if the analog-to-digital converter can directly transform the analog signal to the low-frequency datastreams of different phases, the processing resources of the DSP module is reserved, and the design of the DSP module can be simplified. Because the sampling frequency of the low-frequency datastreams is reduced, a DSP module processing the samples of the low-frequency datastreams can operate at a lower frequency to reduce the power consumption of the system. In addition, if not all samples of the datastreams are required according to the DSP module, only the desired datastreams of predetermined phases are generated by the analog-to-digital converter to improve performance of the entire system.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for converting an analog signal to multiple different phase outputs with an analog-to-digital converter, comprising:

converting the analog signal to a high-frequency datastream with a delta-sigma modulator; and generating a plurality of low-frequency datastreams by periodically extracting the samples of the high-frequency datastream, wherein consecutively extracted samples of the high-frequency datastream are scattered to different low-frequency datastreams;

wherein the low-frequency datastreams have the same sampling rate, and the phases of the corresponding samples of the low-frequency datastreams are different from each other.

2. The method as claimed in claim 1, wherein each corresponding sample of the low-frequency datastreams differs from another by a predetermined phase difference.

3. The method as claimed in claim 1, wherein generating the low-frequency datastreams comprises:

downsampling the high-frequency datastream to obtain a medium-frequency datastream having a first sampling period;

delaying the medium-frequency datastream for a plurality of delay periods to generate a plurality of delayed medium-frequency datastreams, wherein the delay periods are different multiples of the first sampling period; and downsampling the delayed medium-frequency datastreams according to a decimating factor to generate a plurality of delayed low-frequency datastreams, which comprise the low-frequency datastreams.

4. The method as claimed in claim 3, wherein generating the low-frequency datastreams further comprises downsampling the medium-frequency datastream according to the decimating factor to generate an instant low-frequency datastream, wherein the low-frequency datastreams further include the instant low-frequency datastream.

5. The method as claimed in claim 3, wherein the decimating factor is equal to N plus one, wherein N is a natural number, and each of the delayed periods is M times the first sampling period, wherein M is a natural number and ranges from 1 to N.

6. The method as claimed in claim 5, wherein the plurality of delayed periods are respectively 1 to N times the first sampling period.

7. The method as claimed in claim 1, wherein the analog signal is generated by a microphone module according to a sound wave.

8. The method as claimed in claim 1, wherein the low-frequency datastreams are delivered to a digital signal processing (DSP) module to be further processed.

9. An analog-to-digital converter, capable of converting an analog signal to multiple different phase outputs, comprising:
 a delta-sigma modulator, converting the analog signal to a high-frequency datastream; and
 a poly-phase decimator, coupled to the delta-sigma modulator, generating a plurality of low-frequency datastreams by periodically extracting the samples of the high-frequency datastream, wherein consecutively extracted samples of the high-frequency datastream are scattered to different low-frequency datastreams;
 wherein the low-frequency datastreams have the same sampling rate, and the phases of the corresponding samples of the low-frequency datastreams are different from each other.

10. The analog-to-digital converter as claimed in claim 9, wherein each corresponding sample of the low-frequency datastreams differs from another by a predetermined phase difference.

11. The analog-to-digital converter as claimed in claim 9, wherein the poly-phase decimator comprises:
 a first decimator, downsampling the high-frequency datastream to generate a medium-frequency datastream having a first sampling period;
 a plurality of delay modules, coupled to the first decimator, delaying the medium-frequency datastream for different delay periods to generate a plurality of delayed medium-frequency datastreams, wherein all of the delay periods are different multiples of the first sampling period; and
 a plurality of second decimators, coupled to one of the delay modules, respectively downsampling one of the delayed medium-frequency datastreams according to a decimating factor, to generate a plurality of delayed low-frequency datastreams, which comprise the low-frequency datastreams.

12. The analog-to-digital converter as claimed in claim 11, wherein the poly-phase decimator further comprises a third decimator, coupled to the first decimator, downsampling the medium-frequency datastream according to the decimating factor to generate an instant low-frequency datastream, wherein the low-frequency datastreams further include the instant low-frequency datastream.

13. The analog-to-digital converter as claimed in claim 11, wherein the decimating factor is equal to N plus 1, wherein N is a natural number, and each of the delayed periods is M times the first sampling period, wherein M is a natural number and ranges from 1 to N.

14. The analog-to-digital converter as claimed in claim 13, wherein the plurality of delayed periods are respectively 1 to N times the first sampling period.

15. The analog-to-digital converter as claimed in claim 9, wherein the analog signal is generated by a microphone module according to a sound wave.

16. The analog-to-digital converter as claimed in claim 9, wherein the low-frequency datastreams are delivered to a digital signal processing (DSP) module for further processing.

17. A poly-phase decimator, receiving a high-frequency datastream, comprising:
 a first decimator, downsampling the high-frequency datastream to generate a medium-frequency datastream having a first sampling period;
 a plurality of delay modules, coupled to the first decimator, delaying the medium-frequency datastream for different delay periods to generate a plurality of delayed medium-frequency datastreams, wherein all of the delay periods are different multiples of the first sampling period; and
 a plurality of second decimators, coupled to one of the delay modules, respectively downsampling one of the delayed medium-frequency datastreams according to a decimating factor, to generate a plurality of delayed low-frequency datastreams, comprising the output of the poly-phase decimator.

18. The poly-phase decimator as claimed in claim 17, wherein the poly-phase decimator further comprises a third decimator, coupled to the first decimator, downsampling the medium-frequency datastream according to the decimating factor to generate an instant low-frequency datastream, which is also the output of the poly-phase decimator.

19. The poly-phase decimator as claimed in claim 18, wherein the decimating factor is equal to N plus 1, wherein N is a natural number, and each of the delayed periods is M times the first sampling period, wherein M is a natural number and ranges from 1 to N.

20. The poly-phase decimator as claimed in claim 19, wherein the plurality of delayed periods are respectively 1 to N times the first sampling period.

21. The poly-phase decimator as claimed in claim 17, wherein the analog signal is generated by a microphone module according to a sound wave.

22. The poly-phase decimator as claimed in claim 18, wherein the delayed and the instant low-frequency datastreams are delivered to a digital signal processing (DSP) module to be further processed.

* * * * *